(12) United States Patent
Yang et al.

(10) Patent No.: US 8,000,367 B2
(45) Date of Patent: Aug. 16, 2011

(54) HIGH-EFFICIENCY UNIPOLAR QUANTUM CASCADE LASER

(75) Inventors: Quankui Yang, Gundelfingen (DE); Christian Manz, Freiburg (DE)

(73) Assignee: Fraunhofer-Gesellschaft zur Forderung der angewandten Forschung e.V. (DE)

( * ) Notice: Subject to any disclaimer, the term of this patent is extended or adjusted under 35 U.S.C. 154(b) by 137 days.

(21) Appl. No.: 12/447,732

(22) PCT Filed: Jan. 18, 2008

(86) PCT No.: PCT/DE2008/000086
§ 371 (c)(1),
(2), (4) Date: Apr. 29, 2009

(87) PCT Pub. No.: WO2008/086789
PCT Pub. Date: Jul. 24, 2008

(65) Prior Publication Data
US 2010/0067557 A1 Mar. 18, 2010

(30) Foreign Application Priority Data

Jan. 19, 2007 (DE) .......................... 10 2007 002 819

(51) Int. Cl.
*H01S 5/00* (2006.01)
(52) U.S. Cl. ................................. 372/45.012; 372/45.01
(58) Field of Classification Search ............. 372/45.012, 372/50.11, 68, 45.01
See application file for complete search history.

(56) References Cited

U.S. PATENT DOCUMENTS

| 5,509,025 | A |   | 4/1996 | Capasso et al. ................. 372/45 |
|---|---|---|---|---|
| 5,570,386 | A | * | 10/1996 | Capasso et al. ............. 372/46.01 |
| 6,137,817 | A |   | 10/2000 | Baillargeon et al. ............. 372/45 |
| 6,144,681 | A | * | 11/2000 | Capasso et al. ........... 372/45.013 |
| 2005/0036530 | A1 |   | 2/2005 | Schneider et al. ............... 372/46 |
| 2005/0213627 | A1 |   | 9/2005 | Masselink et al. ........ 372/45.011 |
| 2009/0034570 | A1 |   | 2/2009 | Masselink et al. ........ 372/45.012 |

OTHER PUBLICATIONS

Yang et al; GaInAs/.41GaAsSb quantum-cascade lasers; A~sics Letters, vol. 86, No. 131109; Mar. 22, 200.*
Page et al; *300 K operation of a GaAs-based quantum-cascade laser at λ ≈9 μm*; Applied Physics Letters; vol. 78, No. 22, May 28, 2001.

(Continued)

*Primary Examiner* — Armando Rodriguez
(74) *Attorney, Agent, or Firm* — Renner Kenner Greive Bobak Taylor & Weber

(57) ABSTRACT

The present invention pertains to a unipolar quantum cascade laser consisting of several semiconductor multilayer structures (C) that are layered behind one another between two electrodes in a periodic sequence such that an active area (A) and a transitional or injection area (B) respectively alternate. The active areas (A) respectively have at least one upper and one lower energy level for electrons, between which electron transitions (T) emitting light take place. The transitional or injection areas (B) are realized in such a way that they allow the electron transport from the lower energy level of the preceding active area referred to the transport direction into the upper energy level of the following active area referred to the transport direction. In this laser, the active areas (A) comprise at least one quaternary material layer as barrier layer and are realized in such a way that the highest and the second highest local maximum of the square of the quantum-mechanical wave function for the electrons in the upper energy level differ by less than 50%.

14 Claims, 6 Drawing Sheets

OTHER PUBLICATIONS

Yang et al; *Room-temperature short-wavelength ($\lambda$ ~3.7-3.9 $\mu m$ GaInAs/AlAsSb quantum-cascade lasers*; Applied Physics Letters; vol. 88, No. 121127; Mar. 24, 2006.

Yang et al; *GaInAs/AlGaAsSb quantum-cascade lasers*; Applied Physics Letters, vol. 86, No. 131109; Mar. 22, 2005.

Yang et al; *Above room-temperature GaInAs/Al(Ga)AsSb quantum cascade lasers*; Phys. Stat. Sol. (c) 3, No. 3, 415-418 (2006) / DOI 10.1002/pssc.200564173; Feb. 22, 2006.

Gmachl et al; *High-power $\lambda$ ~ 8 $\mu m$ quantum cascade lasers with near optimum performance*; Applied Physics Letters; vol. 72, No. 24; Jun. 15, 1998.

* cited by examiner

FIG. 1 (State of the Art)

FIG. 4 (State of the Art)

HIGH-EFFICIENCY UNIPOLAR QUANTUM CASCADE LASER

TECHNICAL FIELD OF APPLICATION

The present invention pertains to a unipolar quantum cascade laser with several semiconductor multilayer structures that are layered behind one another between two electrodes in a periodic sequence such that a multilayer structure designed for light emission and a multilayer structure designed for electron transport respectively alternate, wherein the multilayer structures designed for light emission comprise at least one quaternary material layer as barrier layer. In a laser of this type, the multilayer structures designed for light emission respectively feature at least one upper and one lower energy level for electrons, between which electron transitions emitting light take place. The multilayer structures designed for electron transport respectively allow the electron transport from the lower energy level of the preceding multilayer structure designed for light emission referred to the transport direction into the upper energy level of the following multilayer structure designed for light emission referred to the transport direction.

Quantum cascade lasers of the aforementioned type represent a subgroup of semiconductor lasers. They emit in the medium to far infrared wavelength range, typically in the range between 3 and 15 µm. The wavelength range between 3 and 5 µm is particularly interesting for numerous applications, for example, because the atmosphere in this wavelength range features a transmission window and many molecules show a very strong absorption at these wavelengths.

Quantum cascade lasers are composed of several semiconductor multilayer structures that are layered behind one another between two control electrodes and form a waveguide for the emitted light. In this case, two differently designed multilayer structures respectively alternate. A multilayer structure designed for light emission represents the generally undoped active area containing at least one upper and one lower energy level for electrons, between which the electron transitions emitting light take place. The other multilayer structure that generally is partially doped represents the so-called injection area, through which electrons are transported from the lower energy level of an adjacent active area into the upper energy level of the adjacent active area on the opposite side referred to the transport direction of the electrons of the laser (and consequently injected at this location). In a laser of this type, the electron transport and the electron transitions take place in the conduction band of the semiconductor multilayer structures. In this case, the multilayer structures form a potential lead of coupled quantum wells that are also referred to as quantum wells below, wherein the electrons propagate from one of the electrodes to the other between the subbands of the potential lead.

STATE OF THE ART

Since the first realization of quantum cascade lasers in the year 1994, these lasers were the subject of constant additional developments. For example, U.S. Pat. No. 5,509,025 A describes a unipolar quantum cascade laser, in which the multilayer structures are realized with a lattice-adapted GaInAs/AlInAs material combination. In a material system of this type, the conduction band offset, however, merely amounts to 0.51 eV such that no sufficient accumulation of the charge carriers can be realized for achieving an efficient laser emission at wavelengths of $\leq 4$ µm.

A quantum cascade laser structure with a conduction band offset of 0.39 eV is described in H. Page et al., "300 K operation of a GaAs-based quantum-cascade laser at $\lambda \approx 9$ µm," Appl. Phys. Lett. 78, No. 22, pp. 3529-3531 (2001).

A clear increase of this offset is achieved if lattice-adapted AlAsSb is used as barrier material instead of AlInAs. The material combination GaInAs/AlAsSb results in a conduction band offset of 1.6 eV. The structure of such a quantum cascade laser that emits at a wavelength around 3.7 µm is shown in Q. Yang et al., "Room-temperature short wavelength ($\lambda \sim 3.7$-3.9 µm) GaInAs/AlAsSb quantum cascade lasers," Appl. Phys. Lett. 88, 121127, pp. 1-3 (2006).

Part of the conduction band profile of this laser is schematically illustrated in FIG. 1. In this illustration, the energy in eV is plotted in dependence on the location in the layer structure (between the electrodes). Quantum cascade lasers are composed of a multitude of stack-like semiconductor multilayer structures that are connected to one another and arranged in a periodic sequence. In this case, one distinguishes between two different multilayer structures A, B that recur several times in the quantum cascade laser in the form of a coherent larger structure C. The area A represents the optically active area and the area B represents the transitional or injection area. Each of the multilayer structures A, B consists of an alternating sequence of semiconductor layers of different material, namely the so-called barrier material such as, e.g., AlAsSb and the so-called well material such as, e.g., GaInAs. The layers with the barrier material form potential barriers and the layers with the well material form quantum wells as shown in FIG. 1. The characteristic meander-shaped band structure of this sequence of layers is also illustrated in FIG. 1. In typical quantum cascade lasers, the combination of active area A and transitional area B illustrated in the figure recurs approximately 30-times, wherein all 30 periods of the structure C result in the amplification region.

The active area A has an upper energy level $E_3$ that represents the permitted upper laser level. In the example shown in FIG. 1, the active area also has two lower energy levels $E_2$ and $E_1$ for the electrons. The square wave function for the electrons that indicates the probability density of the electrons (Schrödinger equation) is indicated for the respective states or energy levels in FIG. 1. Electrons that arrive in the upper energy level $E_3$ relax into the lower energy level $E_2$ while emitting light. In the laser shown, this takes place by means of a vertical transition T that is indicated with the undulating arrow in the figure. This vertical transition takes place in a quantum well and therefore in a semiconductor layer. Consequently, the local maximum of the wave function in the upper laser level $E_3$ is situated at the same position as the local maximum in the lower laser level $E_2$. The additional energy level $E_1$ below the lower laser level $E_2$ serves for the continuous evacuation of the lower laser level $E_2$ with a very short relaxation time between $E_2$ and $E_1$.

The transitional area B is realized in the form of a superlattice that acts as a Bragg reflector and forms a miniband that at least partially overlaps with the lower energy levels $E_2$ and $E_1$ of the directly preceding active area A referred to the transport direction of the electrons (see arrow above the band diagram in FIG. 1). The transport of the electrons from the lowest energy level $E_1$ of the preceding active area into the upper energy level $E_3$ of the following optically active area A' referred to the transport direction of the electrons is realized by means of this miniband. Consequently, the electrons are once again injected into the upper laser level $E_3$ through this transitional area B.

In an additional development of such a quantum cascade laser, a GaInAs/AlGaAsSb material system is used that is arranged on an InP-substrate in a lattice-adapted fashion. The utilization of a quaternary material as barrier layer increases the tunneling probability for the electrons such that the barrier layers can be realized thicker. The function of the layers therefore becomes less dependent on the quality of the interface. The utilization of quaternary layers furthermore provides greater design freedom because the broad adjustability of the Γ-trough allows Γ-conduction band offsets of 0.4 eV to 1.6 eV. The structure of a quantum cascade laser of this type is shown in Q. Yang et al., "Above room-temperature GaInAs/Al(Ga)AsSb quantum cascade lasers," Phys. Stat. Sol. (c), No. 3, pp. 415 to 418 (2006).

Q. Yang et al., "GaInAs/AlGaAsSb quantum cascade lasers," Appl. Phys. Lett. 86, 131109, pp. 1-3 (2005), describes a quantum cascade laser with an emission wavelength of 4.9 µm at room temperature.

DE 10 2004 009 531 A1 describes a quantum cascade laser structure for laser wavelengths between 2.9 and 5.3 µm, the quantum well layers and barrier layers of which are adapted to one another in such a way that existing tensions within a cascade largely compensate one another. The material of at least one barrier layer features at least two material components.

In quantum cascade lasers for small wavelengths of $\lambda \leq 4$ µm, barrier layers with high barriers are used in many known material systems in order to achieve a sufficient accumulation of electrons in the upper laser level. In order to achieve a satisfactory efficiency, however, these barrier layers need to be realized very thin such that problems with respect to the manufacturing quality arise. The utilization of quaternary material systems as they are proposed in the aforementioned publication makes it possible to use thicker layers without lowering the efficiency. However, the efficiency of known quantum cascade lasers still lies considerably below the theoretical limit.

The present invention is based on the objective of disclosing a unipolar quantum cascade laser with a higher efficiency.

DISCLOSURE OF THE INVENTION

This objective is attained with the quantum cascade laser according to Claim 1. Advantageous designs of this laser form the object of the dependent claims or can be gathered from the following description, as well as the exemplary embodiment.

The proposed unipolar quantum cascade laser is conventionally composed of several semiconductor multilayer structures that are layered behind one another between two electrodes in a periodic sequence such that a multilayer structure designed for light emission, namely the so-called active area, and a multilayer structure designed for electron transport, namely the so-called transitional or injection area, respectively alternate. The multilayer structures designed for light emission respectively have at least one upper and one lower energy level for electrons, between which electron transitions emitting light take place. The multilayer structures designed for electron transport are realized in such a way that they allow the electron transport from the lower energy level of the preceding multilayer structure designed for light emission referred to the transport direction into the upper energy level of the following multilayer structure designed for light emission referred to the transport direction. In this laser, the multilayer structures designed for light emission comprise at least one quaternary material layer as barrier layer. The proposed quantum cascade laser is characterized in that the multilayer structures designed for light emission are realized in such a way that a highest local maximum of the square of the quantum-mechanical wave function for the electrons in the upper energy level occurs in a quantum well that lies closest to the preceding multilayer structure designed for electron transport referred to the transport direction, in that a second highest local maximum of the square of the quantum-mechanical wave function of the electrons in the upper energy level lies in a quantum well situated adjacent to the quantum well referred to the transport direction, and in that the highest and the second highest local maximum of the square of the quantum-mechanical wave function for the electrons in the upper energy level differ by less than 50%.

In one preferred embodiment of the quantum cascade laser, the multilayer structures designed for light emission are realized in such a way that a ratio of the highest local maximum of the square of the quantum-mechanical wave function, i.e., the probability density, for the electrons in the upper energy level has a value between 105% and 140% referred to the second highest local maximum of the square of the quantum-mechanical wave function.

In another preferred embodiment of the quantum cascade laser, the multilayer structures designed for light emission are realized in such a way that a ratio of the highest local maximum of the square of the quantum-mechanical wave function, i.e., the probability density, for the electrons in the upper energy level has a value between 105% and 120% referred to the second highest local maximum of the square of the quantum-mechanical wave function.

In this context, needs to be taken into consideration that the development of quantum cascade lasers takes place in a computer-assisted fashion, wherein the layer structure for the desired emission wavelength is determined by means of simulation calculations. At this point, the wave functions and the squares of the wave functions can be respectively influenced with the layer structure (material, doping and thickness of the layers). The suitable layer thicknesses and layer combinations for the structure of the laser are then obtained from the simulations.

The quantum-mechanical wave function or the probability density of the electrons in the upper laser level is chosen such that it has, on one hand, a maximum (highest local maximum) that lies away, i.e., at a different location in space, from the maximum of the wave function of the electrons in the lower laser level. This causes an increase of the coupling efficiency, with which the electrons couple from the injection area into the active area, and an increase of the lifespan of the upper laser state, particularly in comparison with quantum cascade laser structures, the electron wave function maxima of which lie in the same quantum well and in which only vertical transitions take place.

On the other hand, the quantum-mechanical wave function or the probability density of the electrons in the upper laser level has a substantial spatial overlap with the quantum-mechanical wave function or the probability density of the electrons in the lower laser level (second highest local maximum) such that a higher efficiency for radiant transitions of the electrons results. This efficiency is improved, in particular, in comparison with conventional quantum cascade laser structures with diagonal transitions between adjacent quantum wells, in which the spatial overlap of the quantum-mechanical wave functions within a quantum well is maintained as small as possible in order to increase the lifespan of the upper laser state and therefore to achieve the population inversion of the laser states required for the laser activity.

Due to the combination of the quaternary material layers with the inventive realization of the quantum-mechanical wave function, it is possible to achieve a significant increase of the external quantum efficiency, the maximum optical power and the maximum conversion efficiency from electrical power into optical power by a factor between 10 and 20.

The proposed quantum cascade laser therefore makes it possible to achieve a significantly increased efficiency without strict technological requirements with respect to the manufacture, particularly for realizing wavelengths below 4 or 5 μm. Naturally, the invention also makes it possible to realize quantum cascade lasers that emit at higher wavelengths, namely even into the terahertz frequency range. The utilization of quaternary material layers with a broad adjusting range of the energy positions of the conduction band edges (either Γ-trough or X-trough), in connection with the inventive realization of the quantum-mechanical wave function, makes it possible to substantially increase the efficiency. The diagonal transition simplifies the injection of the electrons into the upper laser level because the corresponding quantum well lies closer to the transitional or injection area.

In one preferred embodiment of the quantum cascade laser, the multilayer structures designed for light emission respectively comprise at least three layer pairs that respectively consist of a barrier layer and a quantum well layer. In addition, these multilayer structures are preferably designed in such a way that another energy level is provided in addition to the upper and the lower energy level, wherein this additional energy level lies below the lower energy level and electrons can be evacuated therein from the lower energy level. In this case, the relaxation time needs to be shorter than the relaxation time from the upper energy level or upper laser level into the lower energy level or lower laser level, respectively. The maxima of the square wave functions of these three energy levels preferably lie in three different quantum wells.

Other advantageous embodiments of the proposed quantum cascade laser result from embodiments as they are realized in the publications described in the introductory portion of the description. For example, the coupling between the upper laser level in the optically active area and the miniband for the transport of the electrons can be improved in the transitional area B by improving the overlap between the wave functions of both energy levels or energy bands, respectively, as long as the upper laser level is on the same level with the basic state of the injection area due to the fact that an electric control field is applied.

In addition, the sequence of multilayer structures is preferably applied onto a substrate. This substrate may consist, for example, of indium phosphide (InP), gallium arsenide (GaAs), indium arsenide (InAs) or gallium antimonide (GaSb). The material layers for the quantum wells preferably consist of InGaAs while the barrier layers preferably consist of AlGaAsSb, AlGaInAs, GaInAsSb or AlGaInSb.

The transitional area is preferably realized in such a way that the layer structure forms an optical lattice with a spacing (pitch) that corresponds to a multiple of half the wavelength of the emitted light. In one additional development, two optical confinement layers are arranged on each side of the amplification region, wherein these optical confinement layers guide the emitted light and have the same lattice parameters as the substrate.

A material combination with a high offset of the conduction band of $\geq 1.0$ eV is preferably used in the active area while a material with a low conduction band offset is used in the transitional area. In the active area, InGaAs may be used as quantum well material and AlInAs, GaAs, AlGaInAs, GaInAsSb or AlGaInSb may be used as material for the barrier layer. In the transitional area, the barrier material is preferably selected from the materials AlGaInAs, GaInAsSb or AlGaInSb.

The lattice parameters of the quantum well layers and the barrier layers are preferably chosen such that the lattice parameters of one of the two layers are higher and the lattice parameters of the other layer are lower than the lattice parameters of the substrate.

Typical layer thicknesses for the quantum well layers and the barrier layers lie between 0.1 and 10 nm.

BRIEF DESCRIPTION OF THE DRAWINGS

The proposed unipolar quantum cascade laser is described in greater detail below with reference to one exemplary embodiment in connection with the drawings. In these drawings.

WAYS FOR REALIZING THE INVENTION

Figure 1:
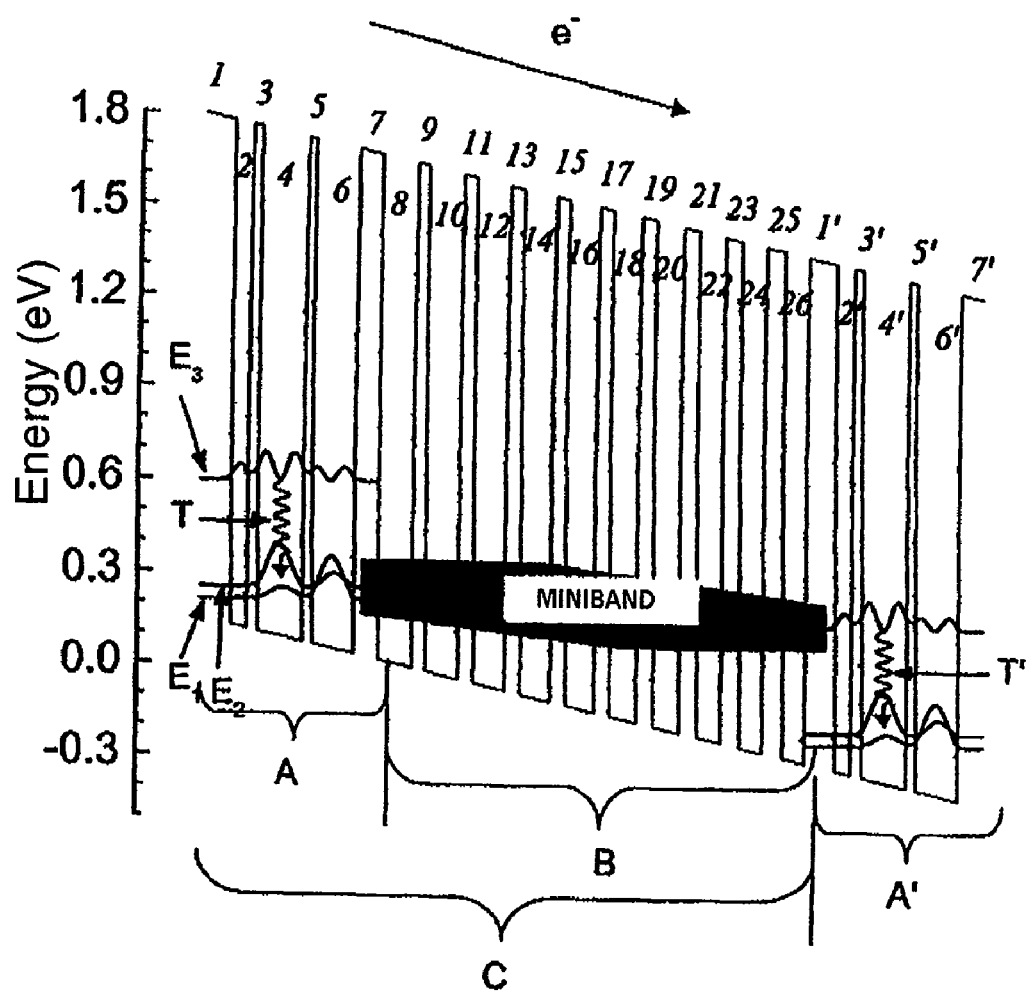
FIG. 1 shows an energy band diagram of a quantum cascade laser according to the state of the art.

The energy band diagram of a known quantum cascade laser according to the state of the art shown in FIG. 1 was already explained in detail in the introductory portion of the description. The following Table 1 shows the materials and layer thicknesses chosen for the individual layers 1 to 26 of this laser. In this case, the quantum well layers are identified by even numbers and the barrier layers are identified by odd numbers. In a laser of this type, the barriers need to be chosen sufficiently high in order to achieve the accumulation of charge carriers required for a laser emission. However, an efficient operation requires relatively thin barrier layers that can create problems during the manufacture.

TABLE 1

| Reference | No. | Material | Dopant | Doping [cm$^{-3}$] | Thickness |
|---|---|---|---|---|---|
| Active area/ amplification region (A) | 1 (injection barrier) | AlAsSb | | | 2.5 nm |
| | 2 | GaInAs | | | 1.4 nm |
| | 3 | AlAsSb | | | 0.8 nm |
| | 4 | GaInAs | | | 3.7 nm |
| | 5 | AlAsSb | | | 0.7 nm |
| | 6 | GaInAs | | | 3.6 nm |
| | 7 | AlAsSb | | | 2.0 nm |
| Injection/ transitional area (B) | 8 | GaInAs | | | 2.9 nm |
| | 9 | AlAsSb | | | 1.1 nm |
| | 10 | GaInAs | | | 2.8 nm |
| | 11 | AlAsSb | | | 1.2 nm |
| | 12 | GaInAs | | | 2.7 nm |
| | 13 | AlAsSb | | | 1.2 nm |
| | 14 | GaInAs | | | 2.6 nm |
| | 15 | AlAsSb | | | 1.2 nm |
| | 16 | GaInAs | | | 2.4 nm |

TABLE 1-continued

| Reference | No. | Material | Dopant | Doping [cm$^{-3}$] | Thickness |
|---|---|---|---|---|---|
| | 17 | AlAsSb | | | 1.2 nm |
| | 18 | GaInAs | Si | 3 × 10$^{17}$ | 2.3 nm |
| | 19 | AlAsSb | | | 1.3 nm |
| | 20 | GaInAs | Si | 3 × 10$^{17}$ | 2.2 nm |
| | 21 | AlAsSb | | | 1.4 nm |
| | 22 | GaInAs | Si | 3 × 10$^{17}$ | 2.1 nm |
| | 23 | AlAsSb | | | 1.5 nm |
| | 24 | GaInAs | Si | 3 × 10$^{17}$ | 2.0 nm |
| | 25 | AlAsSb | | | 1.6 nm |
| | 26 | GaInAs | | | 1.9 nm |

Figure 2:
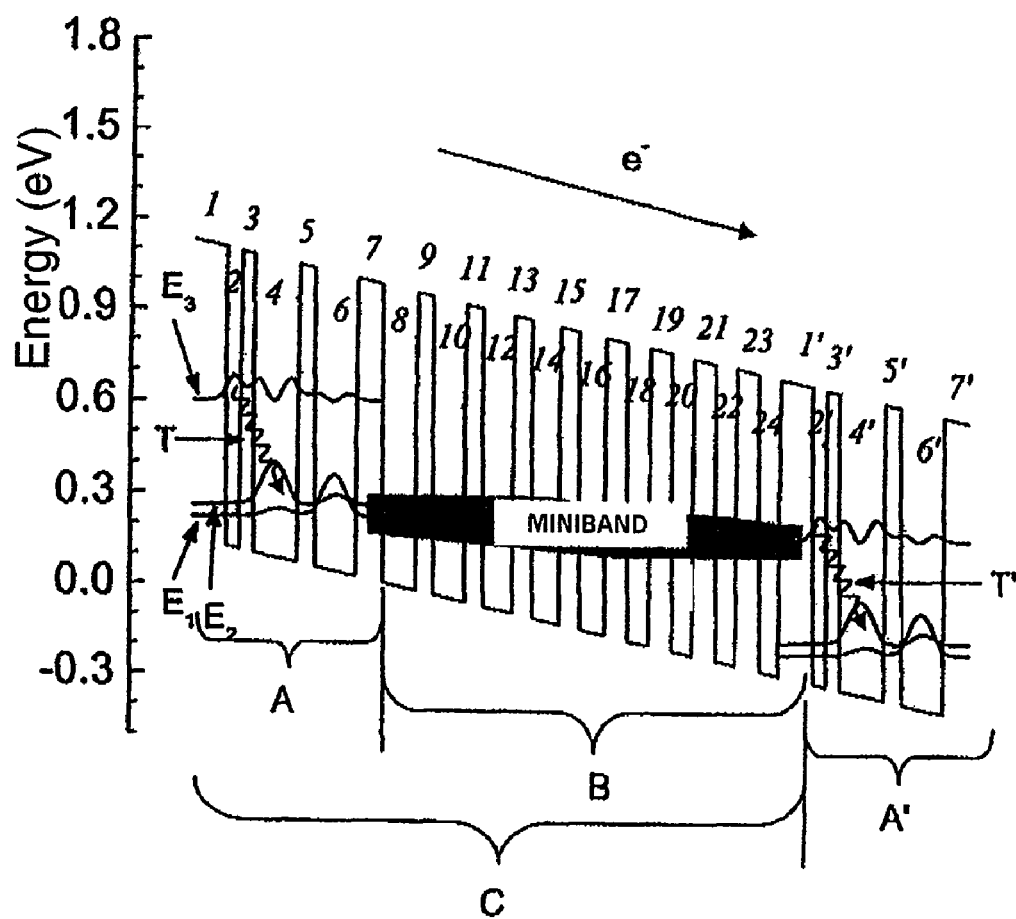
FIG. 2 shows an example for an energy band diagram of the quantum cascade laser according to the present invention.

FIG. 2 shows an example for an energy band diagram of the proposed quantum cascade laser. In this case, the barrier layers are also identified by odd numbers and the quantum well layers are identified by even numbers.

One essential characteristic of this quantum cascade laser can be seen in the special realization of the quantum-mechanical wave function for the electrons in the upper energy level. In connection with the selection of quaternary barrier layers, a significantly higher efficiency of the laser activity is achieved. The maximum of the square wave function in the upper laser level $E_3$ respectively lies in the narrow quantum well layer 2 or 2' directly adjacent to the injection area B in this case. This improves the coupling between the basic state of the transitional or injection area and the upper laser level $E_3$ of the active area in order to achieve a high injection efficiency.

The utilization of an inventive quantum-mechanical wave function, in which diagonal transitions are probable to a corresponding degree in addition to the conventional vertical transitions, was not known until now in quantum cascade lasers in order to increase the efficiency of the laser. A vertical transition is normally realized, for example, as in the publications by Q. Yang et al. that were already mentioned in the introductory portion of the description. Although the other mentioned publication, namely U.S. Pat. No. 5,509,025 A, also shows a diagonal transition in one embodiment, this diagonal transition is not intended to extend the lifespan of the upper laser state. In the embodiment of this publication, the overlap between the square wave function of the upper laser state and the square wave function of the lower laser state consequently is reduced. This results, in particular, in that the second highest local maximum of the square wave function in the upper laser state $E_3$ lies far below 50 percent of the amplitude of the highest local maximum (approximately 10%) in a quantum cascade laser according to this publication. This neither increases the efficiency of this laser nor suggests to a person skilled in the art to increase the efficiency by means of such a measure.

In the quantum cascade laser according to the present example, in contrast, the second highest local maximum of the square wave function in the upper laser level $E_3$ lies clearly above 50 percent (approximately 90%) of the highest local maximum in order to achieve the most efficient operating mode possible. Referred to the second highest local maximum, the highest local maximum has a value of approximately 111%. In addition, the transitional area B is realized in such a way that the coupling between the lower miniband (shaded area in FIG. 2) and the upper laser level $E_3$' is sufficiently high and the electron tunneling probability in the cascade structure is improved.

Another essential characteristic of the quantum cascade laser shown can be seen in the utilization of quaternary materials as barrier layers. In this example, gallium is incorporated into the AlAsSb barrier layer in order to increase the tunneling probability for the electrons. In the quantum cascade laser according to the state of the art that is illustrated in FIG. 1, the GaInAs/AlAsSb heterostructures deliver a conduction band offset (barrier height) of 1.6 eV at the direct band gap. This barrier height is required for building up a sufficient electron concentration in short-wave quantum cascade lasers. However, these barrier layers need to be realized very thin in order to achieve a sufficient tunneling probability. Due to the utilization of quaternary barrier layers, particularly AlGaAsSb, in the present quantum cascade laser, the tunneling probability for the electrons is increased such that the layers can be realized thicker. FIG. 2 clearly shows that the barrier is lower than in FIG. 1. Another advantage of incorporating gallium into the AlAsSb layer can be seen in the reduced average aluminum content of the structure and therefore a reduced probability of premature degradation of the layer structures in air.

Figure 3:
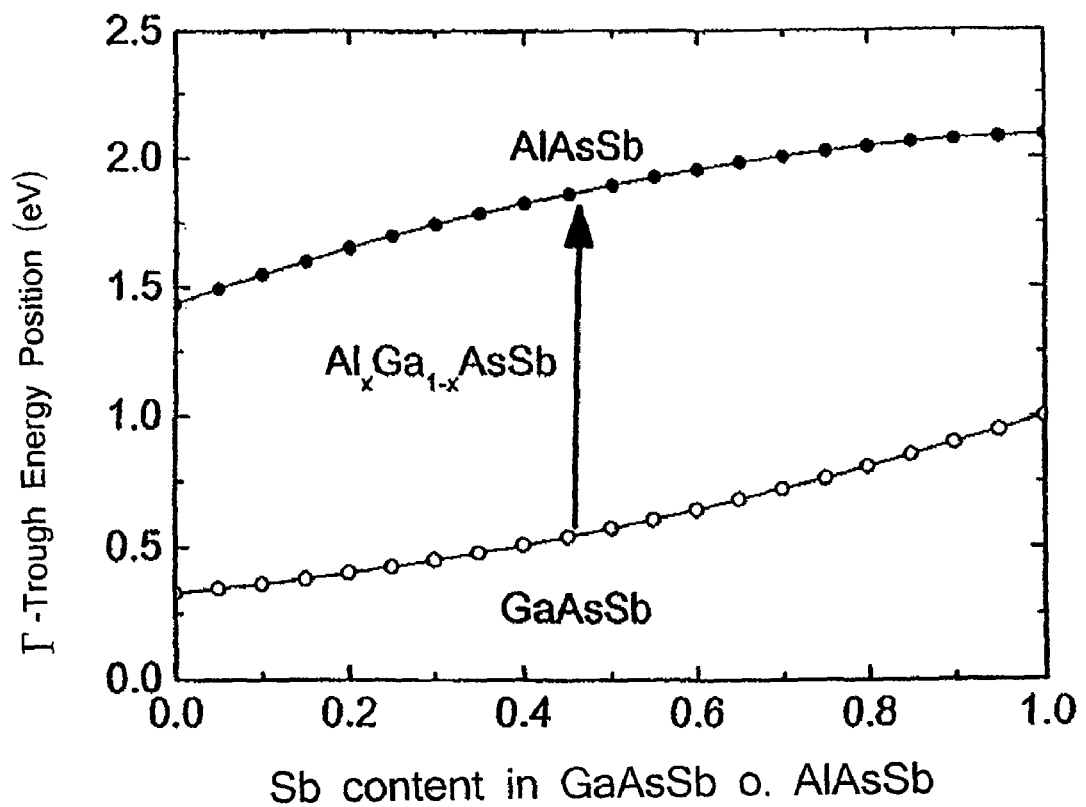
FIG. 3 shows the adjusting range of the energy position of the Γ-trough for AlGaAsSb quaternary material.

The utilization of quaternary material layers also provides broader design freedom in the development of the quantum cascade laser because these material layers have a broad adjusting range for the energetic position of the Γ-trough of an $Al_xGa_{1-x}As_{1-y}Sb_y$ combination. The option of adjusting this energetic position is illustrated in the diagram according to FIG. 3. The Γ-conduction band offset between AlGaAsSb and GaInAs can be adjusted in the range between 0.4 eV and 1.6 eV. In the illustration according to FIG. 3, the zero energy reference position was placed at the upper edge of the valence band of InSb.

In the present example, a layer of $Al_{0.62}Ga_{0.38}AsSb$ is selected, wherein the corresponding barrier height then lies at 1.0 eV and consequently is 0.6 eV lower than that of the laser according to the state of the art shown in FIG. 1.

In the described example, the maximum of the square of the wave function in the upper laser level $E_3$ lies in a narrow quantum well 2 (1.2 nm thickness) directly adjacent to the injection area B. This improves the coupling between the basic miniband of the transitional or injection area B and the upper laser level in the active area such that an improved injection efficiency is achieved. The lower laser level $E_2$ is primarily centered in a wider quantum well 4 (3.7 nm thickness) and coupled to the narrow quantum well 2 by means of a barrier 3 with a thickness of 1 nm. The example shows that a substantial overlap between the wave functions of the upper and the lower laser level can be maintained despite the slightly diagonal transition. This results in a sufficiently high value of the dipole matrix element of the optical transition of 1.1 nm during the operation with an electric field of F=90 kV/cm. The calculated lifespans of the optical phonon dispersion amount to $\tau_{31}$=5.07 ps and $\tau_{32}$=2.99 ps. The lower energy level $E_1$ is realized such that it lies below the lower energy level $E_2$ by approximately the amount of energy of a longitudinal optical phonon in order to be able to quickly evacuate this lower laser state. The lifespan $\tau_{21}$ of this transition only lies at approximately 0.43 ps, i.e., far below the lifespan of the upper laser state of $\tau_{32}$=2.99 ps. This ensures the population inversion between the upper and the lower laser level required for the laser activity. The emission wavelength of the exemplary quantum cascade laser described lies at λ=3.7 μm.

TABLE 2

| Reference | No. | Material | Dopant | Doping [cm$^{-3}$] | Thickness |
|---|---|---|---|---|---|
| Active area/ amplification region (A) | 1 (injection barrier) | AlGaAsSb | | | 2.8 nm |

TABLE 2-continued

| Reference | No. | Material | Dopant | Doping [cm$^{-3}$] | Thickness |
|---|---|---|---|---|---|
| | 2 | GaInAs | | | 1.2 nm |
| | 3 | AlGaAsSb | | | 1.1 nm |
| | 4 | GaInAs | | | 3.7 nm |
| | 5 | AlGaAsSb | | | 1.4 nm |
| | 6 | GaInAs | | | 3.5 nm |
| | 7 | AlGaAsSb | | | 2.2 nm |
| Injection/ | 8 | GaInAs | | | 2.9 nm |
| transitional | 9 | AlGaAsSb | | | 1.4 nm |
| area (B) | 10 | GaInAs | | | 2.7 nm |
| | 11 | AlGaAsSb | | | 1.5 nm |
| | 12 | GaInAs | | | 2.5 nm |
| | 13 | AlGaAsSb | | | 1.6 nm |
| | 14 | GaInAs | | | 2.3 nm |
| | 15 | AlGaAsSb | | | 1.7 nm |
| | 16 | GaInAs | Si | 3 × 10$^{17}$ | 2.1 nm |
| | 17 | AlGaAsSb | | | 1.8 nm |
| | 18 | GaInAs | Si | 3 × 10$^{17}$ | 1.9 nm |
| | 19 | AlGaAsSb | | | 1.9 nm |
| | 20 | GaInAs | Si | 3 × 10$^{17}$ | 1.8 nm |
| | 21 | AlGaAsSb | | | 1.9 nm |
| | 22 | GaInAs | Si | 3 × 10$^{17}$ | 1.7 nm |
| | 23 | AlGaAsSb | | | 2.0 nm |
| | 24 | GaInAs | | | 1.7 nm |

Table 2 shows in detail the materials and layer thicknesses of this laser that form the optically active area A and the transitional area or injection area B. The overall structure C consisting of these two areas is connected in series 30-times in order to realize the comparison with the quantum cascade laser according to the state of the art (FIG. 1). The 30 periods of the overall structure form the gain zone of the quantum cascade laser.

Figure 4:
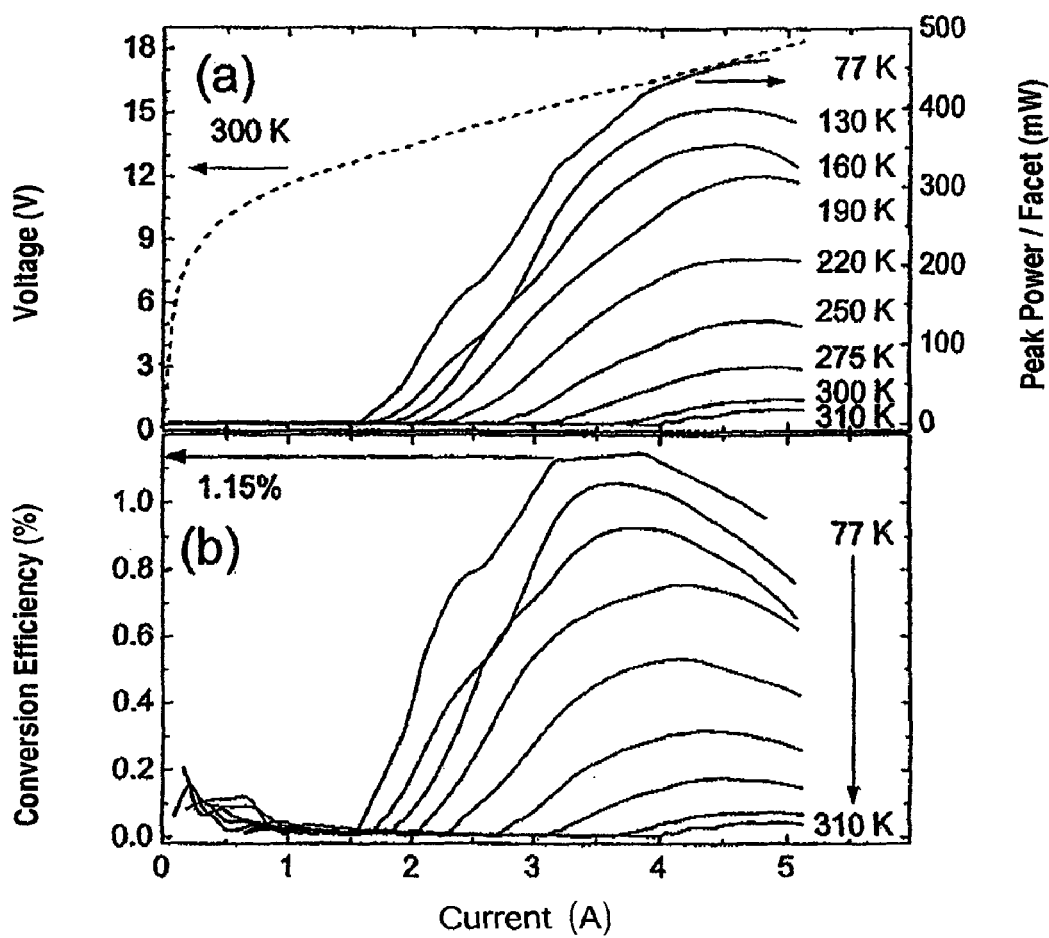
FIG. 4a shows an example for the light output of a quantum cascade laser according to the state of the art.
FIG. 4b shows an example for the conversion efficiency of a quantum cascade laser according to the state of the art.
Figure 5:
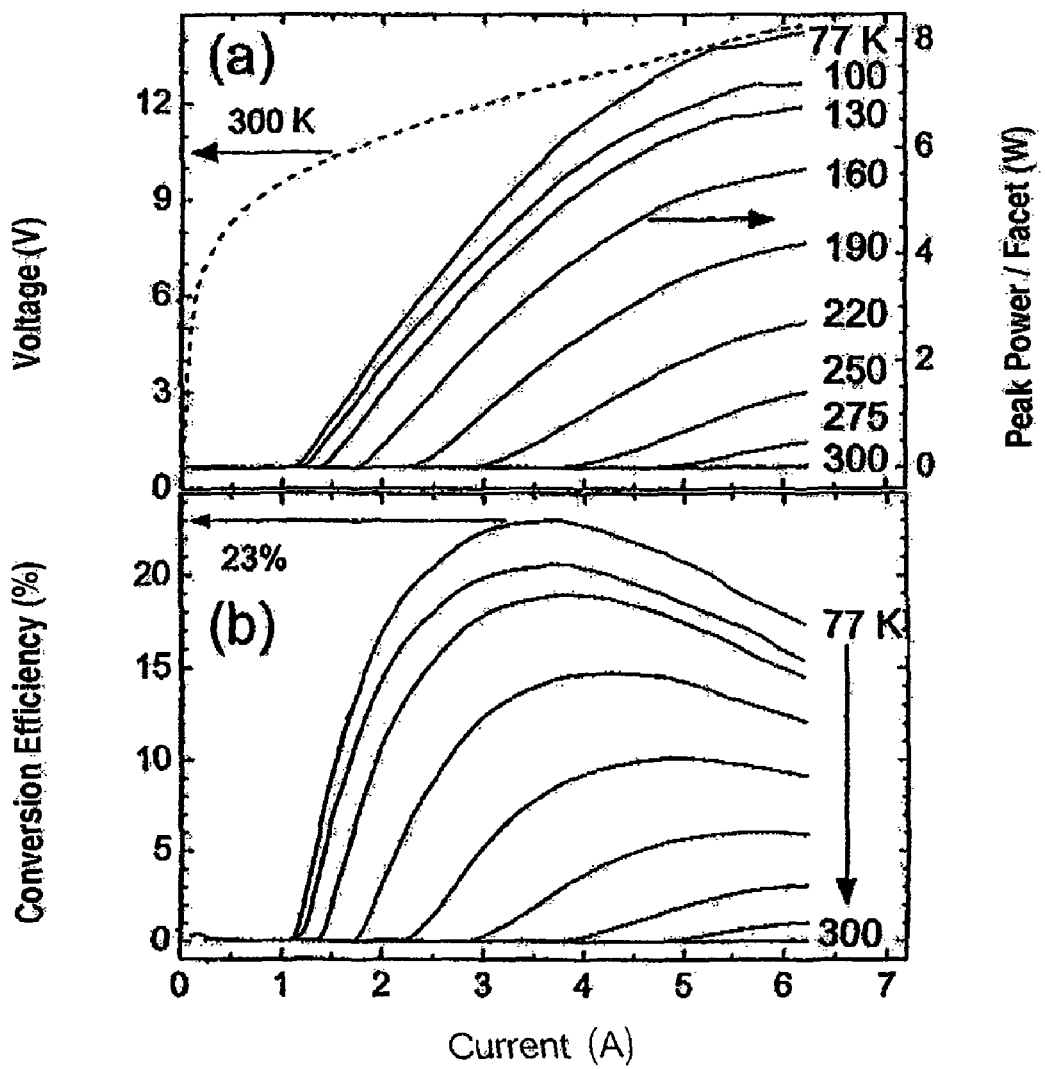
FIG. 5a shows an example for the light output of the proposed quantum cascade laser.
FIG. 5b shows an example for the conversion efficiency of the proposed quantum cascade laser.

FIGS. 4 and 5 show corresponding comparative measurements on the two lasers. In order to directly compare the quantum cascade laser proposed in this example to the quantum cascade laser according to FIG. 1 and Table 1, an identical number of 30 periods of semiconductor multilayer structures was produced on a basic InP substrate. After the manufacture of these lasers and the contacting of the corresponding contacting electrodes, the lasers were operated with current pulses with a pulse duration of 100 ns and a repetition rate of 1 kHz. The light emitted by the lasers was collimated with an extra-axial parabolic mirror with f/1.6 and focused either in a Fourier transformation spectrometer that was equipped with a thermoelectrically cooled mercury-cadmium-tellurite detector and boxcar electronics for recording the laser spectrum or on a calibrated pyroelectric detector for room temperature in order to carry out the direct power measurements.

FIG. 4a shows the measured light output in dependence on the injection current in the laser according to FIG. 1 with a size of 14 μm×3.0 mm, namely at different cooling body temperatures. This figure also makes it possible to read out a voltage-current characteristic of 300 K. The maximum peak power per facet of the laser amounts to approximately 31 mW at 300 K. If only the light emission of one facet is observed, the increased efficiency of the laser respectively amounts to 197 mW/A and 33 mW/A at 77 K and 300 K. Calculated in accordance with $\eta_D=(2e/h\nu)(\delta P/\delta I)$, these values are equivalent to an external quantum efficiency of 118% at 77 K and 21% at 300 K, wherein e represents the electron charge, hν represents the photon energy and δP/δI represents the increased efficiency.

FIG. 4b shows the measured temperature-dependent total conversion efficiency from electrical to optical power as a function of the injection current of the aforementioned laser according to the state of the art. In this context, the term total conversion efficiency means that the light emission of both facets was measured. The maximum conversion efficiency merely amounts to 1.15% at 77 K.

FIGS. 5a and 5b, in comparison, show the measurements on the proposed quantum cascade laser with a size of 18 μm×2.7 mm. According to these measurements, the maximum peak power per facet amounts to 8.2 W at 77 K while the conversion efficiency of the conversion from electrical to optical power reaches a maximum value of 23.2%. If only the light emission of one facet is observed, the increased efficiency of the laser amounts to 2690 mW/A at 77 K and 113 mW/A at 300 K. These values correspond to a total external differential quantum efficiency of $\eta_D=1584\%$ at 77 K or $\eta_D=69\%$ at 300 K. These values are up to 20-times higher than those of the known laser according to the state of the art.

Figure 6:
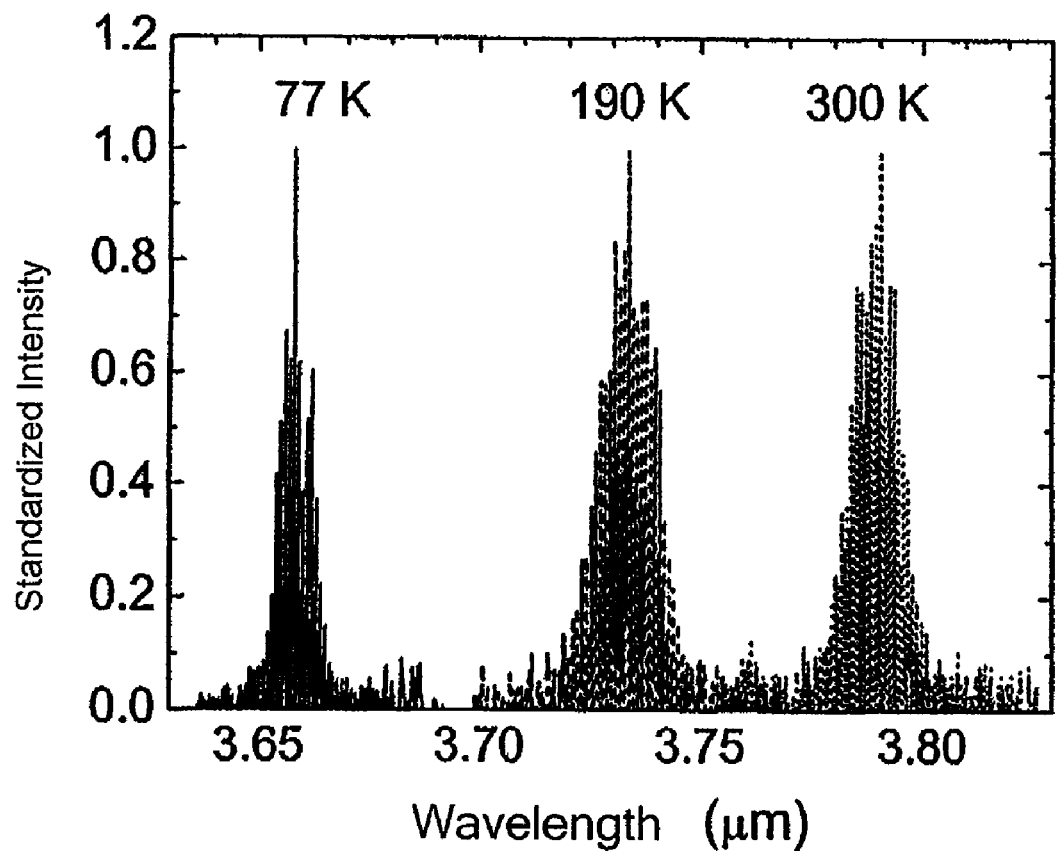
FIG. 6 shows examples for standardized emission spectrums of the proposed quantum cascade laser at different temperatures.

FIG. 6 shows emission spectrums of the proposed quantum cascade laser at cooling body temperatures of 77 K, 190 K and 300 K. At the corresponding temperatures, the emission wavelength of this laser lies at 3.65 μm, 3.73 μm and 3.79 μm. The emission wavelengths are approximately identical to those of the described laser according to the state of the art (FIG. 1, Table 1).

Table 3 once again summarizes the improvements of the proposed quantum cascade laser according to this exemplary embodiment over the described quantum cascade laser according to the state of the art. The measurements and the table make it clear that the laser realized in accordance with the present invention has a significantly higher maximum output (17.8-times higher), a significantly higher external quantum efficiency (13.4-times higher) and a significantly higher conversion efficiency (20.2-times higher) than the known laser.

TABLE 3

| Value at 77K | State of the Art | Invention | Improvement factor |
|---|---|---|---|
| Emission wavelength [μm] | 3.73 | 3.65 | — |
| Threshold current density [kA/cm$^2$] | 3.90 | 2.38 | 1.64 |
| Maximum peak output [mW] | 460 | 8200 | 17.8 |
| Increased efficiency [mW/A] | 197 | 2690 | 13.7 |
| Total external quantum efficiency [%] | 118 | 1584 | 13.4 |
| Maximum conversion efficiency electrical → optical | 1.15 | 23.2 | 20.2 |

Consequently, the present invention realizes a unipolar quantum cascade laser with the following advantages:

- A significant improvement of the injection efficiency of electrons from the miniband of the transitional area into the upper laser level of the active area. This can significantly improve the external quantum efficiency and significantly increase the maximum output.
- The implementation of one or more quaternary material layers provides more freedom in designing a quantum cascade laser due to the broad adjusting range of the energy positions of the band edges of the quaternary material. This also makes it possible to realize terahertz quantum cascade lasers, in which low barriers are required for achieving a sufficient tunneling probability of the electrons.
- Due to the at least one quaternary barrier layer with a reduced conduction band offset within the quantum cascade structure, it is possible to realize thicker layers than in conventional lasers that do not feature such a quaternary layer. Consequently, it is no longer necessary to utilize special layer growth techniques such as molecular beam epitaxy (MBE) for the layer build-up.

| LIST OF REFERENCE SYMBOLS | |
|---|---|
| A | Optically active area |
| B | Injection or transitional area |
| C | Layer structure of one period of the laser |
| T | Light-emitting transition |

The invention claimed is:

1. A unipolar quantum cascade laser with several semiconductor multilayer structures that are layered behind one another between two electrodes in a periodic sequence such that a multilayer structure designed for light emission and a multilayer structure designed for electron transport respectively alternate,
wherein the multilayer structures designed for light emission respectively feature at least one upper and one lower energy level for electrons, between which electron transitions emitting light take place, and the multilayer structures designed for electron transport respectively allow the electron transport from the lower energy level of the preceding multilayer structure designed for light emission referred to the transport direction into the upper energy level of the following multilayer structure designed for light emission referred to the transport direction, and
wherein the multilayer structures designed for light emission comprise at least one quaternary material layer as barrier layer, characterized in
that the multilayer structures designed for light emission are realized in such a way that a highest local maximum of the square of the quantum-mechanical wave function for the electrons in the upper energy level occurs in a first quantum well that lies closest to the preceding multilayer structure designed for electron transport referred to the transport direction, in that a second highest local maximum of the square of the quantum-mechanical wave function of the electrons in the upper energy level lies in a second quantum well situated adjacent to the first quantum well referred to the transport direction, and in that the highest and the second highest local maximum of the square of the quantum-mechanical wave function for the electrons in the upper energy level differ by less than 50%.

2. The quantum cascade laser according to claim 1, characterized in
that a ratio of the highest local maximum of the square of the quantum-mechanical wave function for the electrons in the upper energy level has a value between 105% and 140% referred to the second highest local maximum of the square of the quantum-mechanical wave function.

3. The quantum cascade laser according to claim 2, characterized in
that the ratio has a value between 105% and 120%.

4. The quantum cascade laser according to claim 1, wherein the multilayer structures designed for light emission respectively comprise at least three layer pairs that respectively consist of a barrier layer and a quantum well layer.

5. The quantum cascade laser according to claim 1, wherein the multilayer structures designed for light emission respectively have three energy levels, between which electron transitions take place.

6. The quantum cascade laser according to claim 1, wherein the multilayer structures designed for electron transport form a superlattice that acts as a Bragg reflector for the emitted light.

7. The quantum cascade laser according to claim 1, wherein the multilayer structures designed for electron transport form an optical lattice with a pitch that corresponds to a multiple of half the wavelength of the emitted light.

8. The quantum cascade laser according to claim 1, wherein the multilayer structures are applied onto a substrate of InP, GaAs, InAs, or GaSb.

9. The quantum cascade laser according according to claim 8, characterized in
that the lattice parameters of the quantum well layers and the barrier layers are chosen such that the lattice parameters of the quantum layers are higher and the lattice parameters of the barrier layers are lower than the lattice parameters of the substrate.

10. The quantum cascade laser according to claim 8, wherein an optical confinement layer is arranged on each side of an amplification region of the laser that is formed by the several multilayer structures, wherein this optical confinement layer guides the emitted light and has the same lattice parameters as the substrate.

11. The quantum cascade laser according to claim 1, wherein the multilayer structures feature quantum well layers of InGaAs and barrier layers of AlGaAsSb or AlGaInAs or GaInAsSb or AlGaInSb.

12. The quantum cascade laser according to claim 1, wherein the multilayer structures designed for light emission consist of a material combination with an offset of the conduction band of 1.0 eV and the multilayer structures designed for electron transport consist of a material combination with a lower offset of the conduction band.

13. The quantum cascade laser according to claim 12, characterized in
that the multilayer structures designed for light emission feature quantum well layers of InGaAs and barrier layers of AlInAs or GaAs or AlGaInAs or GaInAsSb or AlGaInSb, and in that the multilayer structures designed for electron transport feature barrier layers of AlGaInAs or GaInAsSb or AlGaInSb.

14. The quantum cascade laser according to claim 8, characterized in
that the lattice parameters of the quantum well layers and the barrier layers are chosen such that the lattice parameters of the barrier layers are higher and the lattice parameters of the quantum layers are lower than the lattice parameters of the substrate.

* * * * *

UNITED STATES PATENT AND TRADEMARK OFFICE
CERTIFICATE OF CORRECTION

| | | |
|---|---|---|
| PATENT NO. | : 8,000,367 B2 | |
| APPLICATION NO. | : 12/447732 | |
| DATED | : August 16, 2011 | |
| INVENTOR(S) | : Yang et al. | |

It is certified that error appears in the above-identified patent and that said Letters Patent is hereby corrected as shown below:

In Column 12, line 40 (Claim 12, line 4) the typographical character "$\geq$" was erroneously omitted between the word "of" and the number "1.0 eV" - the claim should read --band of $\geq$1.0 eV--.

Signed and Sealed this
Eighteenth Day of October, 2011

David J. Kappos
*Director of the United States Patent and Trademark Office*